United States Patent
Kliewer et al.

(10) Patent No.: US 12,166,504 B2
(45) Date of Patent: Dec. 10, 2024

(54) SYSTEMS AND METHODS FOR DECODING OF GRAPH-BASED CHANNEL CODES VIA REINFORCEMENT LEARNING

(71) Applicant: New Jersey Institute of Technology, Newark, NJ (US)

(72) Inventors: Joerg Kliewer, Fair Lawn, NJ (US); Allison Beemer, Eau Claire, WI (US); Salman Habib, Newark, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 0 days.

(21) Appl. No.: 17/954,120

(22) Filed: Sep. 27, 2022

(65) Prior Publication Data

US 2023/0231575 A1 Jul. 20, 2023

Related U.S. Application Data

(60) Provisional application No. 63/249,412, filed on Sep. 28, 2021.

(51) Int. Cl.
H03M 13/11 (2006.01)

(52) U.S. Cl.
CPC .... *H03M 13/1131* (2013.01); *H03M 13/1125* (2013.01); *H03M 13/1128* (2013.01)

(58) Field of Classification Search
CPC ......... H03M 13/1131; H03M 13/1128; H03M 13/1126
See application file for complete search history.

(56) References Cited

U.S. PATENT DOCUMENTS

| | | | | |
|---|---|---|---|---|
| 2021/0152282 A1* | 5/2021 | Huang | ....... | H04B 7/08 |
| 2021/0162282 A1* | 6/2021 | Solano | ....... | A63B 57/203 |
| 2021/0271549 A1* | 9/2021 | Khayat | ....... | G11C 29/028 |
| 2022/0029637 A1* | 1/2022 | Jeon | ....... | H03M 13/618 |
| 2022/0209888 A1* | 6/2022 | Hoydis | ....... | G06N 3/08 |
| 2022/0329262 A1* | 10/2022 | Liu | ....... | H03M 13/1111 |
| 2023/0012648 A1* | 1/2023 | Fitzpatrick | ....... | G11C 29/028 |
| 2023/0155607 A1* | 5/2023 | Tullberg | ....... | H04L 1/0045 |
| | | | | 714/776 |

FOREIGN PATENT DOCUMENTS

WO  WO 2007/110436  10/2007

OTHER PUBLICATIONS

A. V. Casado, M. Griot, and R. D. Wesel, "LDPC decoders with informed dynamic scheduling," IEEE Trans. of Comm., vol. 58, No. 12, pp. 3470-3479, Dec. 2010.

(Continued)

*Primary Examiner* — Samir W Rizk
(74) *Attorney, Agent, or Firm* — McCarter & English, LLP

(57) ABSTRACT

Embodiments of the present disclosure relate to sequential decoding of moderate length low-density parity-check (LDPC) codes via reinforcement learning (RL). The sequential decoding scheme is modeled as a Markov decision process (MDP), and an optimized cluster scheduling policy is subsequently obtained via RL. A software agent is trained to schedule all check nodes (CNs) in a cluster, and all clusters in every iteration. A new RL state space model is provided that enables the RL-based decoder to be suitable for longer LDPC codes.

14 Claims, 7 Drawing Sheets

(56) References Cited

OTHER PUBLICATIONS

C. J. C. H. Watkins, "Learning from delayed rewards," Ph.D. dissertation, King's College, 1989.
D. J. Costello, Jr., L. Dolecek, T. Fuja, J. Kliewer, D. G. M. Mitchell, and R. Smarandache, "Spatially coupled sparse codes on graphs: theory and practice," IEEE Comm. Mag., vol. 52, No. 7, pp. 168-176, 2014.
F. Carpi, C. Hager, M. Martalo, R. Raheli, and H. D. Pfister, "Reinforcement learning for channel coding: Learned bit-flipping decoding," Proceedings of 57th Allerton Conf. on Communication, Control and Computing, 2019.
H. Kfir and I. Kanter, "Parallel versus sequential updating for belief propagation decoding," Physica A, vol. 330, pp. 259-270, 2003.
J. C. Gittins, "Bandit processes and dynamic allocation indices," J. R. Statistics Soc. B, vol. 41, No. 2, pp. 148-163, 1979.
J. L. Fan, "Soft Decoding of Several Classes of Array Codes," in Proceedings of Intl. Symp. on Information Theory, 2002, pp. 543-546.
J. Zhang and M. Fossorier, "Shuffled belief propagation decoding," in Proc. 36th Annual Asilomar Conf. Signals, Syst. Comput., 2002, pp. 368.
M. Fossorier, M. Mihaljevic, and H. Imai, "Reduced complexity iterative decoding of Low Density Parity Check codes based on belief propagation," IEEE Trans. Commun., vol. 47, pp. 673-680, May 1999.
M. O. Duff, Q-Learning for Bandit Problems. CMPSCI Technical Report 95-26, 1995.
R. G. Gallager, "Low-density parity-check codes," Doctoral Dissertation, Massachusetts Institute of Technology, Cambridge, Massachusetts, 1963.
R. M. Tanner, "A recursive approach to low complexity codes," IEEE Trans. Inf. Theory, vol. 27, No. 5, pp. 547-553, Sep. 1981.
R. S. Sutton and A. G. Barto, Reinforcement Learning: An Introduction, 2nd Edition. The MIT Press Cambridge, 2018.
S. Chung, G. D. Forney, T. J. Richardson, and R. Urbanke, "On the design of low-density parity-check codes within 0.0045 db of the Shannon limit," IEEE Commun. Lett., vol. 5, pp. 58-60, Feb. 2001.
S. Habib, A. Beemer, and J. Kliewer, "Belief propagation decoding of short graph-based channel codes via reinforcement learning," IEEE J. Sel. Areas Inf. Theory (Early Access), 2021.
S. Habib, A. Beemer, and J. Kliewer., "Learning to decode: Reinforcement learning for decoding of sparse graph-based channel codes," Advances in Neural Information Processing Systems, pp. 22 396-22 406, 2020. [Online]. Available: https://proceedings.neurips.cc/paper/2020/ file/fdd5b16fc8134339089ef25b3cf0e588-Paper.pdf.
V. Mnih, K. Kavukcuoglu, D. Silver, A. A. Rusu, J. Veness, M. G. Bellemare, A. Graves, M. Riedmiller, A. K. Fidjeland, and G. O. et al., "Human-level control through deep reinforcement learning," Nature, vol. 518, No. 7540, 2015.
Y. Kou, S. Lin, and M. Fossorier, "Low density parity-check codes based on finite geometries: A rediscovery and new results," IEEE Trans. Inf. Theory, vol. 47, pp. 2711-2736, Nov. 2001.
Y. Li, "Deep reinforcement learning," [Online]. Available: arXiv.org, arXiv:1810.06339v1 [cs.LG], 2018.

* cited by examiner

500

---

Algorithm 1: The RL-SD Scheme

---

Input : L, H
Output: $\hat{x}$

1 Initialization:
2     $I \leftarrow 0$
3     $m_{c \rightarrow v} \leftarrow 0$     // for all CN to VN messages
4     $m_{v \rightarrow c} \leftarrow L_v$     // for all VN to CN messages
5 if $I < I_{\max}$ then
6     foreach *cluster index a* do
7        Determine state $s_a^{(I)}$
8     end
9     Obtain an optimized cluster scheduling order $\pi_i^{*(I)}$
10     foreach *cluster with index* $a_i$ do
       // decode cluster via flooding
11        foreach CN $c$ *in cluster* $a_i$ do
12           foreach VN $v \in \mathcal{N}(c)$ do
13              compute and propagate $m_{c \rightarrow v}^{(I)}$
14           end
15        end
16        foreach VN $v$ *in the subgraph of cluster* $a_i$ do
17           foreach CN $c \in \mathcal{N}(v)$ do
18              compute and propagate $m_{v \rightarrow c}^{(I)}$
19           end
20           $\hat{L}_I^{(v)} \leftarrow \sum_{c \in \mathcal{N}(v)} m_{c \rightarrow v}^{(I)} + L_v$     // update posterior LLR
21        end
       // hard-decision step
22        foreach VN $v$ *in the subgraph of cluster* $a_i$ do
23           if $\hat{L}_I^{(v)} \geq 0$ then
24              $\hat{x}_{v,a_i}^{(I)} \leftarrow 0$
25           end
26           else
27              $\hat{x}_{v,a_i}^{(I)} \leftarrow 1$
28           end
29        end
30        $i \leftarrow i + 1$
31     end
32     if $H\hat{x} = 0$ then
33        break     // stopping condition reached
34     end
35     $I \leftarrow I + 1$
36 end

| Algorithm 2: Standard Q-learning for Sequential LDPC Decoding |
|---|

```
   Input  : 𝓛, H
   Output: optimized cluster scheduling policy
 1 Initialization: Q_0(s_u, a_u) ← 0 for all s_u, a_u and u
 2 for each L ∈ 𝓛 do
 3   │ ℓ ← 0
 4   │ while ℓ < ℓ_max do
 5   │   │ select cluster a according to an ε-greedy policy π_Q^(ℓ)
     │   │ // decode cluster via flooding
 6   │   │ foreach CN c in cluster a do
 7   │   │   │ foreach VN v ∈ 𝒩(c) do
 8   │   │   │   │ compute and propagate m_{c→v}^(ℓ)
 9   │   │   │ end
10   │   │ end
11   │   │ foreach VN v in the subgraph of cluster a do
12   │   │   │ foreach CN c ∈ 𝒩(v) do
13   │   │   │   │ compute and propagate m_{v→c}^(ℓ)
14   │   │   │ end
15   │   │   │ L̂_ℓ^(v) ← Σ_{c∈𝒩(v)} m_{c→v}^(ℓ) + L_v              // update posterior LLR
16   │   │ end
     │   │ // determine cluster output
17   │   │ foreach VN v in the subgraph of cluster a do
18   │   │   │ if L̂_ℓ^(v) ≥ 0 then
19   │   │   │   │ x̂_{v,a}^(ℓ) ← 0
20   │   │   │ end
21   │   │   │ else
22   │   │   │   │ x̂_{v,a}^(ℓ) ← 1
23   │   │   │ end
24   │   │ end
25   │   │ determine index s_a of x̂_a
26   │   │ update R_ℓ(s_a, a, f(s_a, a)) based on x̂_a
27   │   │ compute Q_{ℓ+1}(s_a, a)
28   │   │ ℓ ← ℓ + 1
29   │ end
30 end
```

FIG. 6

SYSTEMS AND METHODS FOR DECODING OF GRAPH-BASED CHANNEL CODES VIA REINFORCEMENT LEARNING

RELATED APPLICATIONS

The present application claims priority to and the benefit of U.S. Provisional Application No. 63/249,412, filed on Sep. 28, 2021, which is incorporated by reference herein in its entirety.

GOVERNMENT RIGHTS

This invention was made with government support under Grant No. ECCS-1711056 awarded by the U.S. National Science Foundation. The government has certain rights in the invention.

BACKGROUND

Binary low-density parity-check (LDPC) codes are sparse graph-based channel codes whose rates approach the capacity of symmetric binary input channels. Due to their excellent error correcting performance over noisy channels, LDPC codes have recently been standardized for error correction in 5G cellular new radio systems such as mobile phones. Error correction is done by detecting the status of parity bits. When a parity check failure is detected for a data bit, information from the multiple parity bits associated with the data bits are used to retrieve the original/correct value for the data bit.

Tanner graphs of LDPC codes are sparse bipartite graphs whose vertex sets are partitioned into check nodes (CNs) and variable nodes (VNs). Typically, iterative decoding on an LDPC Tanner graph is carried out via flooding: all CNs and VNs are updated simultaneously in each iteration. In contrast, sequential LDPC decoding seeks to optimize the order of node updates to improve the convergence speed and/or the decoding performance with respect to the flooding scheme. One approach to sequential decoding of LDPC codes is to use a node-wise scheduling (NS) algorithm, where a single CN is scheduled per decoding iteration based on its residual, given by the magnitude of the difference between two successive messages emanating from that CN. Using sequential decoding and scheduling CNs with higher residuals is expected to lead to faster and more reliable decoding compared to the flooding scheme. To obviate the need for computing residuals, a reinforcement learning (RL)-based NS (RL-NS) scheme was previously proposed. Model-free RL methods have also been considered by (1) computing the Gittins index of each CN, and (2) utilizing standard Q-learning. In addition to model-free RL, a model-based RL-NS approach based on Thompson sampling has also been considered.

SUMMARY

Embodiments of the present disclosure improve sequential decoding performance of low-density parity-check (LDPC) codes by implementing a reinforcement learning (RL) based process that sequentially updates clusters in each iteration, as opposed to a single check node (CN), until a stopping condition or a maximum number of iterations is reached. In each scheduling instant, a cluster's neighbors are updated via flooding based on the latest messages propagated by its neighboring clusters.

Embodiments of the present disclosure provide for RL-based sequential decoding processes to optimize the scheduling of CN clusters for moderate length LDPC codes. Embodiments of the present disclosure include a new state space model built using the collection of outputs of clusters. Deep reinforcement learning (DRL) can be applied for cluster size 3 and standard Q-learning for smaller clusters. Experimental results show that by learning the cluster scheduling order, embodiments of the present disclosure can outperform a random scheduling scheme, irrespective of the cluster size. The performance gains include lowering both bit error rate (BER) and message-passing complexity.

In accordance with embodiments of the present disclosure, systems, methods, and non-transitory computer-readable media are disclosed for sequentially decoding low-density parity-check codes encoded in a traffic channel of a communication signal received by a mobile communication device. The non-transitory computer-readable medium storing instructions for decoding low-density parity-check codes and a processing device can execute the instructions to perform a method that includes training a reinforcement learning software agent of an LDPC decoder to learn to schedule each check node in a cluster and to schedule each cluster sequentially depending on a reward associated with an outcome of scheduling a particular cluster for each iteration; decoding scheduled check node clusters in each iteration; updating a posterior log-likelihood ratio of all variable nodes (VNs) based on the decoding; determining whether a specified maximum number of iterations has been reached or a stopping condition has been satisfied; and outputting a reconstructed signal corresponding to the communication signal received by the mobile communication device in response to determining the specified maximum number of iterations or the stopping condition is reached.

In accordance with embodiments of the present disclosure, systems, methods, and non-transitory computer-readable media are disclosed for sequentially decoding low-density parity-check codes encoded in a traffic channel of a communication signal received by a mobile communication device. The non-transitory computer-readable medium storing instructions for decoding low-density parity-check codes and a processing device can execute the instructions to perform a method that includes generating a decoding schedule for a plurality of clusters of check nodes in response to execution of a reinforcement learning-based software agent of an LDPC decoder; sequentially decoding each of the plurality of clusters of check nodes according to the learned decoding policy; updating a posterior log-likelihood ratio of all variable nodes (VNs) based on the decoding; determining whether a specified maximum number of iterations has been reached or a stopping condition has been satisfied; and in response to determining the specified maximum number of iterations or the stopping condition is reached, outputting a reconstructed signal corresponding to the communication signal received by the mobile communication device.

In accordance with embodiments of the present disclosure, the reinforcement learning software agent can be trained to schedule sequential decoding of the plurality of clusters of check nodes based on a reward associated with an outcome of decoding each of the plurality of clusters of check nodes. The reward corresponds to a probability that corrupted bits of the communication signal are correctly reconstructed. A cluster scheduling policy is based on the training of the reinforcement learning software agent. The decoding schedule is determined based on the learned cluster scheduling policy.

In accordance with embodiments of the present disclosure, the check nodes can be clustered to minimize inter-cluster dependency.

In accordance with embodiments of the present disclosure, the reinforcement learning software agent can implement at least one of a Q-learning scheme or a deep reinforcement learning scheme to generate the decoding schedule.

Any combination and/or permutation of embodiments are envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

FIG. 5 illustrates an embodiment of an RL-SD algorithm of the LDPC decoder for sequential LDPC code decoding in accordance with embodiments of the present disclosure.

FIG. 6 illustrates an embodiment of a standard Q-learning algorithm for learning the check node scheduling order in accordance with embodiments of the present disclosure.

DETAILED DESCRIPTION

Figure 1:
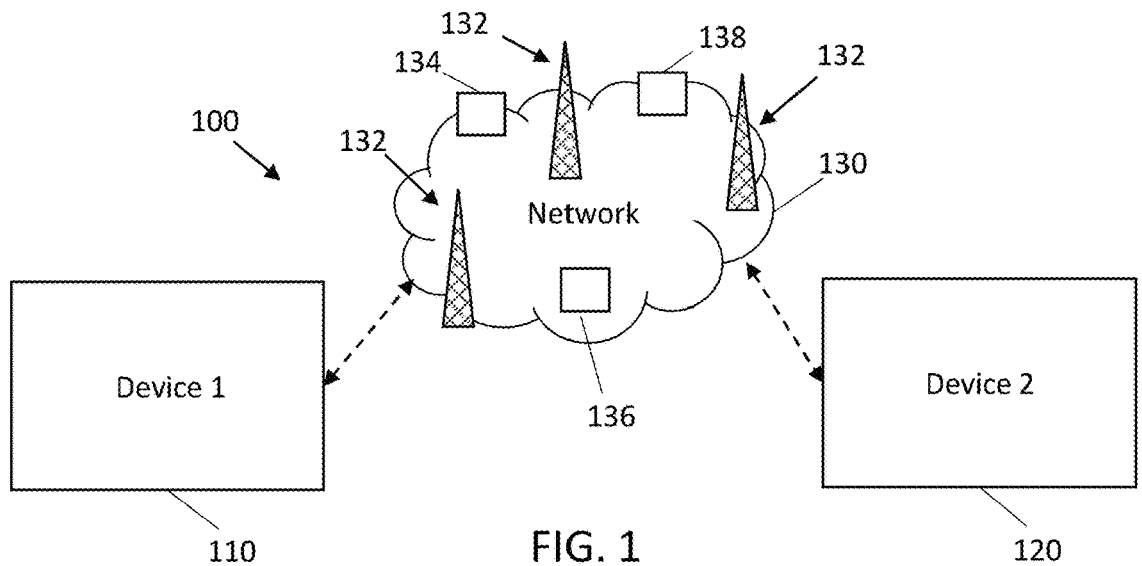
FIG. 1 illustrates an example environment within which a mobile communication device communicates over a network in accordance with embodiments of the present disclosure.

Embodiments of the present disclosure provide for systems and methods for sequential decoding of moderate length low-density parity-check (LDPC) codes via reinforcement learning (RL). The sequential decoding process can be embodied in an LDPC decoder including a reinforcement learning software agent executed in a mobile communication device and can be modeled as a Markov decision process (MDP). An optimized cluster scheduling policy can be subsequently obtained via RL. In contrast to conventional approaches, where a software agent learns to schedule only a single check node (CN) within a group (cluster) of CNs per iteration, in embodiments of the present disclosure the software agent of the LDPC decoder is trained to schedule all CNs in a cluster, and all clusters in every iteration. That is, in accordance with embodiments of the present disclosure, in each RL step, the software agent of the LDPC decoder learns to schedule CN clusters sequentially depending on the reward associated with the outcome of scheduling a particular cluster.

Embodiments of the present disclosure provide an LDPC decoder with a new RL state space model, which has a significantly smaller number of states than previously proposed models, enabling embodiments of the RL-based LDPC decoder of the present disclosure to be suitable for much longer LDPC codes. As a result, embodiments of the RL-based LDPC decoder described herein exhibit a signal-to-noise ratio (SNR) gain of approximately 0.8 dB for fixed bit error probability over the conventional flooding approach.

With respect to LDPC codes, an [n, k] binary linear code is a k-dimensional subspace of $F_2^n$, and can be defined as the kernel of a binary parity-check matrix $H \in F_2^{m \times n}$, where $m \geq n-k$. The code's block length is n, and the rate is (n−rank(H))/n. The Tanner graph of a linear code with parity-check matrix H is the bipartite graph $G_H = (V \cup C, E)$, where $V = \{v_0, \ldots, v_{n-1}\}$ is a set of variable nodes (VNs) corresponding to the columns of H, $C = \{c_0, \ldots, c_{m-1}\}$ is a set of check nodes (CNs) corresponding to the rows of the parity-check matrix H, and edges in E correspond to columns (or VNs) and rows (or CNs) in parity-check matrix H that contain a "1". LDPC codes are a class of highly competitive linear codes defined via sparse parity-check matrices or, equivalently, sparse Tanner graphs, and are amenable to low-complexity graph-based message-passing decoding algorithms, making them ideal for practical applications in telecommunications and other fields. One example of a decoding algorithm for which LDPC codes are suitable is belief propagation (BP) iterative decoding.

Experimental results for embodiments the LDPC decoder that utilize two particular classes of LDPC codes—(γ, k)-regular and array-based (AB-) LDPC codes—are described herein. A (γ, k)-regular LDPC code is defined by a parity-check matrix with constant column and row weights equal to γ and k, respectively. A (γ, p) AB-LDPC code, where p is prime, is a (γ, p)-regular LDPC code with additional structure in its parity-check matrix, H(γ, p). In particular, $$H(\gamma, p) = \begin{bmatrix} I & I & I & \cdots & I \\ I & \sigma & \sigma^2 & \cdots & \sigma^{p-1} \\ \vdots & \vdots & \vdots & \cdots & \vdots \\ I & \sigma^{\gamma-1} & \sigma^{2(\gamma-1)} & \cdots & \sigma^{(\gamma-1)(p-1)} \end{bmatrix}, \quad (1)$$

where $\sigma^z$ denotes the circulant matrix obtained by cyclically left-shifting the entries of the p×p identity matrix I by z (mod p) positions. Notice that $\sigma^0 = I$. In embodiment of the present disclosure, lifted LDPC codes can be obtained by replacing non-zero (resp., zero) entries of the parity-check matrix with randomly generated permutation (resp., all-zero) matrices.

In an RL problem, a software agent (learner) interacts with an environment whose state space can be modeled as a finite Markov decision process (MDP). The software agent takes actions that alter the state of the environment and receives a reward in return for each action, with the goal of maximizing the total reward in a series of actions. The optimized sequence of actions can be obtained by employing a cluster scheduling policy which utilizes an action-value function to determine how beneficial an action is for maximizing the long-term expected reward. For embodiments described herein, let $[[x]]=\{0, \ldots, x-1\}$, where x is a positive integer. As an example, an environment can allow m possible actions. A random variable $A_l \in [[m]]$, with realization $\alpha$, represents the index of an action taken by the software agent during learning step l. The current state of the environment before taking action $A_l$ is represented as $S_l$, with realization $s \in Z$, and $S_{l+1}$, with realization $s'$, represents a new state of the MDP after executing action $A_l$. A state space S contains all possible state realizations. The reward yielded at step l after taking action $A_l$ in state $S_l$ is represented as $R_l(S_l, A_l, S_{l+1})$.

Optimal policies for MDPs can be estimated via Monte Carlo techniques such as Q-learning. The estimated action-value function $Q_l(S_l, A_l)$ in Q-learning represents the expected long-term reward achieved by the software agent at step l after taking action $A_l$ in state $S_l$. To improve the estimation in each step, the action-value function can be adjusted according to a recursion $$Q_{l+1}(s, a) = (1-\alpha)Q_l(s, a) + \alpha\left(R_l(s, a, s') + \beta \max_{a' \in [[m]]} Q_l(s', a')\right) \quad (2)$$

where $s'$ represents the new state $s_0$ as a function of s and $\alpha$, $0<\alpha<1$ is the learning rate, $\beta$ is the reward discount rate, and $Q_{l+1}(s, \alpha)$ is a future action-value resulting from action $\alpha$ in the current state s. Note that the new state is updated with each action. The optimal cluster scheduling policy for the software agent, $\pi^{(l)}$, in state s is given by $$\pi^{(l)} = \text{argmax}_a Q_l(s, \alpha), \quad (3)$$

where l is the total number of learning steps elapsed after observing the initial state $S_0$. In the case of a tie, an action can be uniformly chosen at random from all the maximizing actions.

An embodiment of the RL-based sequential decoding (RL-SD) process can include a belief propagation (BP) decoding algorithm in which the environment is given by the Tanner graph of the LDPC code, and the optimized sequence of actions, i.e., the scheduling of individual clusters, can be obtained using a suitable RL algorithm such as Q-learning. A single cluster scheduling step can be carried out by sending messages from all CNs of a cluster to their neighboring VNs, and subsequently sending messages from these VNs to their CN neighbors. That is, a selected cluster executes one iteration of flooding in each decoding instant. Every cluster is scheduled exactly once within a single decoder iteration. Sequential cluster scheduling can be carried out until a stopping condition is reached, or an iteration threshold is exceeded. The RL-SD method relies on a cluster scheduling policy based on an action-value function, which can be estimated using the RL techniques described herein.

FIG. 1 illustrates an example environment 100 to facilitate communications and/or the transfer of data between communication devices. As a non-limiting example, a first user of a first mobile communication device or handset 110 can communicate with a second user of a second mobile communication device or handset 120 via a communication channel established by a network 130 between the first and second mobile communication devices 110 and 120. The network 130 can include, for example, one or more base stations 132, routers 134, switches 136, and/or servers 138.

The (first) mobile communication device 110 can encode (e.g., with LDPC codes) and modulate a radiofrequency (RF) signal and transmit the RF signal which can be routed through the network 130 and transmitted to the (second) communication device 120, which can demodulate and decode the received RF signal to extract the voice data. In an exemplary embodiment, the first mobile communication device 110 can use LDPC codes for channel coding on the traffic channel. When the second mobile communication device 120 receives the RF signal, the second mobile communication device can extract the LDPC codes from the RF signal and use the extracted LDPC codes to correct channel errors by maintaining parity bits for data bits transmitted via the traffic channel. When a parity check failure is detected by the second mobile communication device 120 for one or more data bits, information from the multiple parity bits of the LDPC codes associated with the one or more data bits can be used by the second mobile communication device 120 to determine the original/correct value for the one or more data bits.

Figure 2:
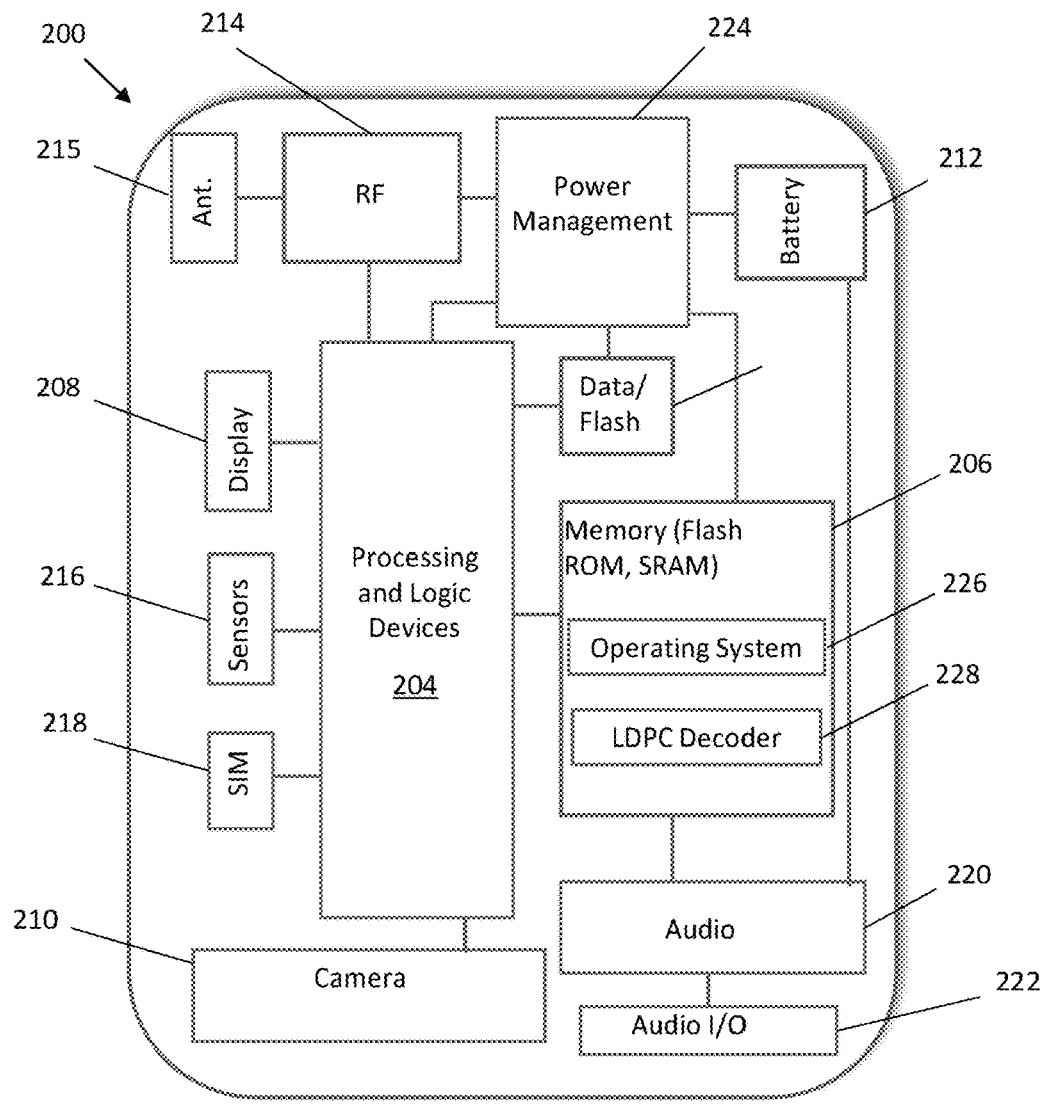
FIG. 2 illustrates an example mobile communication device in accordance with embodiments of the present disclosure.

FIG. 2 is a block diagram of an example of an embodiment of a mobile communication device 200 in accordance with embodiments of the present disclosure. The mobile communication device 200 can be a smartphone, tablet, subnotebook, laptop, personal digital assistant (PDA), and/or any other suitable mobile communication device that includes or can be programmed and/or configured to communicate with other communication devices via a communication network (e.g., network 130). The mobile communication device 200 can include one or more processing and/or logic devices 204, such as digital signal processors (DSP), microprocessors, microcontrollers, and/or graphical processing units (GPUs), field programmable gate arrays (FPGAs), application specific circuits (ASICs), and the like. The mobile communication device 200 can also include memory/storage 206 in the form a non-transitory computer-readable medium, a display unit 208, a battery 212, and a radio frequency circuitry 214. The camera 210 can be programmed and/or configured to capture images of scenes. Some embodiments of the mobile communication device 200 can also include other components, such as sensors 216 (e.g., accelerometers, gyroscopes, piezoelectric sensors, light sensors, LIDAR sensors), subscriber identity module (SIM) card 218, audio components 220 and 222 (e.g., microphones and/or speakers), and power management circuitry 224.

The memory 206 can include any suitable, non-transitory computer-readable storage medium, e.g., read-only memory (ROM), erasable programmable ROM (EPROM), electrically-erasable programmable ROM (EEPROM), random access memory (RAM), flash memory, and the like. In exemplary embodiments, an operating system 226 and an embodiment of the LDPC decoder 228 can be embodied as computer-readable/executable program code stored on the non-transitory computer-readable memory 206 and implemented using any suitable, high or low-level computing language, scripting language, or any suitable platform, such as, e.g., Java, C, C++, C #, assembly code, machine-readable language, Python, Rails, Ruby, and the like. The memory 206 can also store data to be used by and/or that is generated by the LDPC decoder 228. While memory 206 is depicted as a single component, those skilled in the art will recognize that the memory can be formed using multiple components and that separate non-volatile and volatile memory devices can be used.

One or more processing and logic devices 204 can be programmed and/or configured to facilitate an operation of the mobile communication device 200 and enable RF communications with other communication devices via a network (e.g., network 130). The processing and/or logic devices 204 can be programmed and/or configured to execute the operating system 226 and the LDPC decoder 228 to implement one or more processes to perform one or more operations (decoding of LDPC codes, error detection and correction). As an example, a microprocessor, microcontroller, central processing unit (CPU), or graphical processing unit (GPU) can be programmed to execute the LDPC decoder 228. As another example, the LDPC decoder 228 can be embodied and executed by an application-specific integrated circuit (ASIC). The processing and/or logic devices 204 can retrieve information/data from and store information/data to the memory 206. For example, the processing device 204 can retrieve and/or store LDPC codes and/or any other suitable information/data that can be utilized by the mobile communication device to perform error detection and correction using LDPC codes.

The LDPC decoder 228 can include a reinforcement learning (RL) software agent that can sequentially decode the low-density parity-check (LDPC) codes included in the RF signal via reinforcement learning (RL). The sequential decoding process implemented by the software agent can be trained to schedule all check nodes (CNs) in a cluster, and all clusters in every iteration, such that in each RL step, the software agent of the LDPC decoder 228 learns to schedule CN clusters sequentially depending on the reward associated with the outcome of scheduling a particular cluster.

The RF circuitry 214 can include an RF transceiver, one or more modulation circuits, one or more demodulation circuits, one or more multiplexers, one or more demultiplexers. The RF circuitry 214 can be configured to transmit and/or receive wireless communications via an antenna 215 pursuant to, for example, the 3rd Generation Partnership Project (3GPP) for 5G NR and/or the International Telecommunications Union (ITU) IMT-2020.

The display unit 208 can render user interfaces, such as graphical user interfaces (GUIs) to a user and in some embodiments can provide a mechanism that allows the user to interact with the GUIs. For example, a user may interact with the mobile communication device 200 through the display unit 208, which may be implemented as a liquid crystal touchscreen (or haptic) display, a light-emitting diode touchscreen display, and/or any other suitable display device, which may display one or more user interfaces that may be provided in accordance with exemplary embodiments.

The power source 212 can be implemented as a battery or capacitive elements configured to store an electric charge and power the mobile communication device 200. In exemplary embodiments, the power source 212 can be a rechargeable power source, such as a battery or one or more capacitive elements configured to be recharged via a connection to an external power supply.

Figure 3:
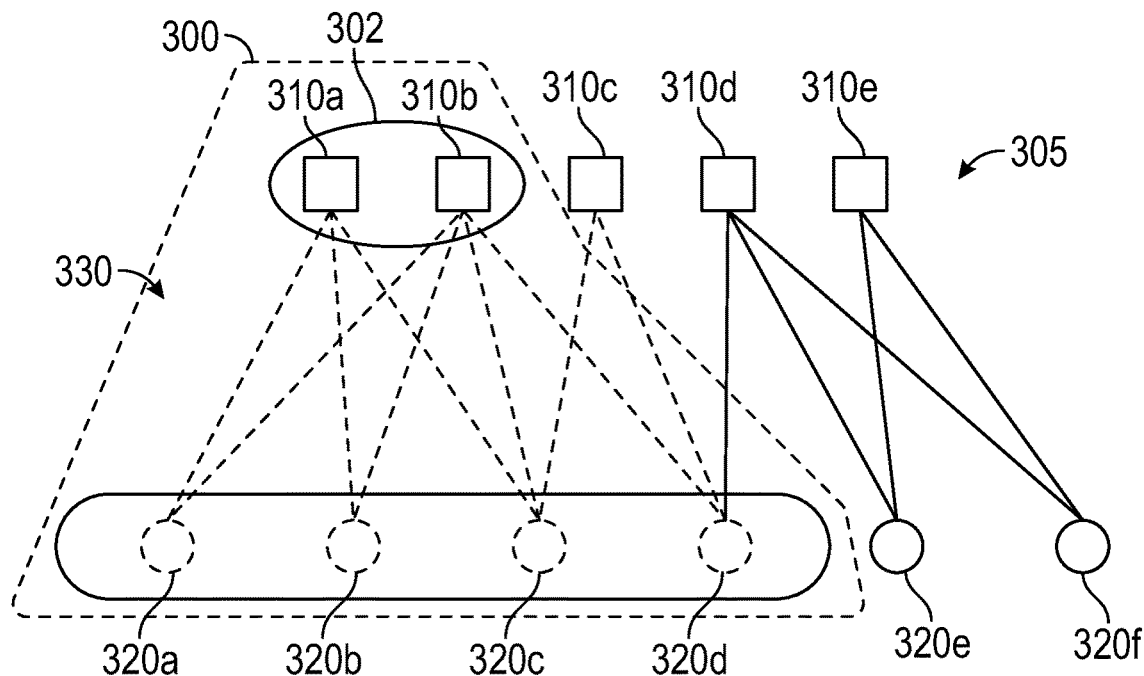
FIG. 3 illustrates an example of a cluster-induced subgraph, shown with check nodes (CNs), edges, and variable nodes (VNs) in accordance with embodiments of the present disclosure.

FIG. 3 illustrates an example of a graph 305 that includes a cluster-induced subgraph 300 for a cluster size z=2 of an example parity-check matrix. The graph 305 includes check nodes (CNs) 310a-310e, variable nodes (VNs) 320, and edges 330 extending between check nodes 310a-310e and the variable nodes 320a-f. The cluster-induced subgraph 300 includes check nodes (CNs) 310a-310b, variable nodes (VNs) 320a-d, and edges 330 extending between check nodes 310a-310b and the variable nodes 320a-d. An edge extends from a check node to a variable node if there is a "1" in the row and column of the parity-check matrix H corresponding to the nodes. A cluster 302 having a cluster size z=2 includes check nodes 310a and 310b. Since the full LDPC Tanner graph is connected and contains cycles, there exist dependencies between the messages propagated by the different clusters of the LDPC code. Consequently, the output of a cluster can depend on previously scheduled clusters. To improve RL performance, an embodiment of the LDPC decoder 228 can ensure that the clusters are as independent as possible. The choice of clustering can be determined prior to learning using a cycle-maximization method, where the clusters are selected to maximize the number of cycles in the cluster-induced subgraph 300 in order to minimize inter-cluster dependencies.

The transmitted and the received words can be represented as $x=[x_0, \ldots, x_{n-1}]$ and $y=[y_0, \ldots, y_{n-1}]$, respectively, where for $v \in [[n]]$, the values of each transmitted word include 0's and/or 1's ($x_v \in \{0,1\}$) and the value of each received word can be represented as $y_v=(-1)^{x_v}+z$ with $z \sim \mathcal{N}(0, \sigma^2)$. The posterior log-likelihood ratio (LLR) of a transmitted bit $x_v$ can be expressed as $$L_v = \log \frac{Pr(x_v = 1 \mid y_v)}{Pr(x_v = 0 \mid y_v)}.$$

The posterior LLR computed by VN v during iteration I can be represented as $L_I^{(v)} = \Sigma_{c \in \mathcal{N}(v)} m_{c \to v}^{(I)} + L_v$, where $L_0^{(v)} = L_v$ and $m_{c \to v}^{(I)}$ is the message received by VN v from neighboring CN c in iteration I. Similarly, the posterior LLR computed during iteration I by VN j in the subgraph induced by the cluster with index $\alpha \in [[\lceil m/z \rceil]]$ can be represented as $L_I^{(j,a)}$. Hence, $L_I^{(j,a)} = L_I^{(v)}$ if VN v in the Tanner graph is also the jth VN in the subgraph induced by the cluster with index $\alpha$.

After scheduling cluster a during iteration I, the output $$\hat{x}_a^{(I)} = \left[ x_{0,a}^{(I)}, \ldots, x_{l_a-1,a}^{(I)} \right]$$

of cluster $\alpha$, where $1_\alpha \leq z^* k_{max}$ is the number of VNs adjacent to cluster $\alpha$, is obtained by taking hard decisions on the vector of posterior LLRs $$\hat{L}_{I,a} = \left[ L_I^{(0,a)} \ldots L_I^{(l_a-1,a)} \right],$$

computed according to $$x_{j,a}^{(I)} = \begin{cases} 0 & \text{if } \hat{L}_I^{(j,a)} \geq 0, \\ 1 & \text{otherwise} \end{cases} \quad (4)$$

The output, $\hat{x}_\alpha^{(I)}$ of cluster $\alpha$ includes the bits reconstructed by the sequential decoder after scheduling cluster a during iteration I. An index of a realization of $\hat{x}_\alpha^{(I)}$ in iteration I can be denoted by $s_\alpha^{(I)} \in [[2^{l_\alpha}]]$. The collection of all possible signals $\hat{x}_0^{(I)}, \ldots, \hat{x}_{\lceil m/z \rceil-1}^{(I)}$ at the end of decoder iteration I forms the state of the MDP associated with the RL process implemented by embodiments of the LDPC decoder 228. At the end of iteration I, the fully reconstructed signal estimate $$\hat{x} = [\widehat{x_0}, \ldots, \widehat{x_{n-1}}]$$

can be obtained.

During the learning/training phase, embodiments of the RL process inform the software agent of the current state of the LPDC decoder and the reward obtained after performing an action (decoding a cluster). Based on these observations, the software agent of the LDPC decoder 228 can take future actions, to enhance the total reward earned, which alters the state of the environment as well as the future reward. Given that the transmitted communication signal x is known during the training phase, a vector containing the $l_\alpha$ bits of x that are reconstructed in the output $\hat{x}_\alpha^{(l)}$ of a cluster can be represented as $x_\alpha = [x_{0,\alpha}, \ldots, x_{l_\alpha-1,\alpha}]$. In each learning step l, the reward $R_\alpha$ obtained by the software agent after scheduling cluster $\alpha$ is defined as $$R_a = \frac{1}{l_a} \sum_{j=0}^{l_a-1} 1(x_{j,a} = \widehat{x_{j,a}}), \tag{5}$$

where 1(•) denotes the indicator function. Thus, the reward earned by the software agent after scheduling cluster $\alpha$ is identical to the probability that the corrupted bits corresponding to the transmitted bits $x_{0,\alpha}, \ldots, x_{l_\alpha-1,\alpha}$ are correctly reconstructed.

Figure 4:
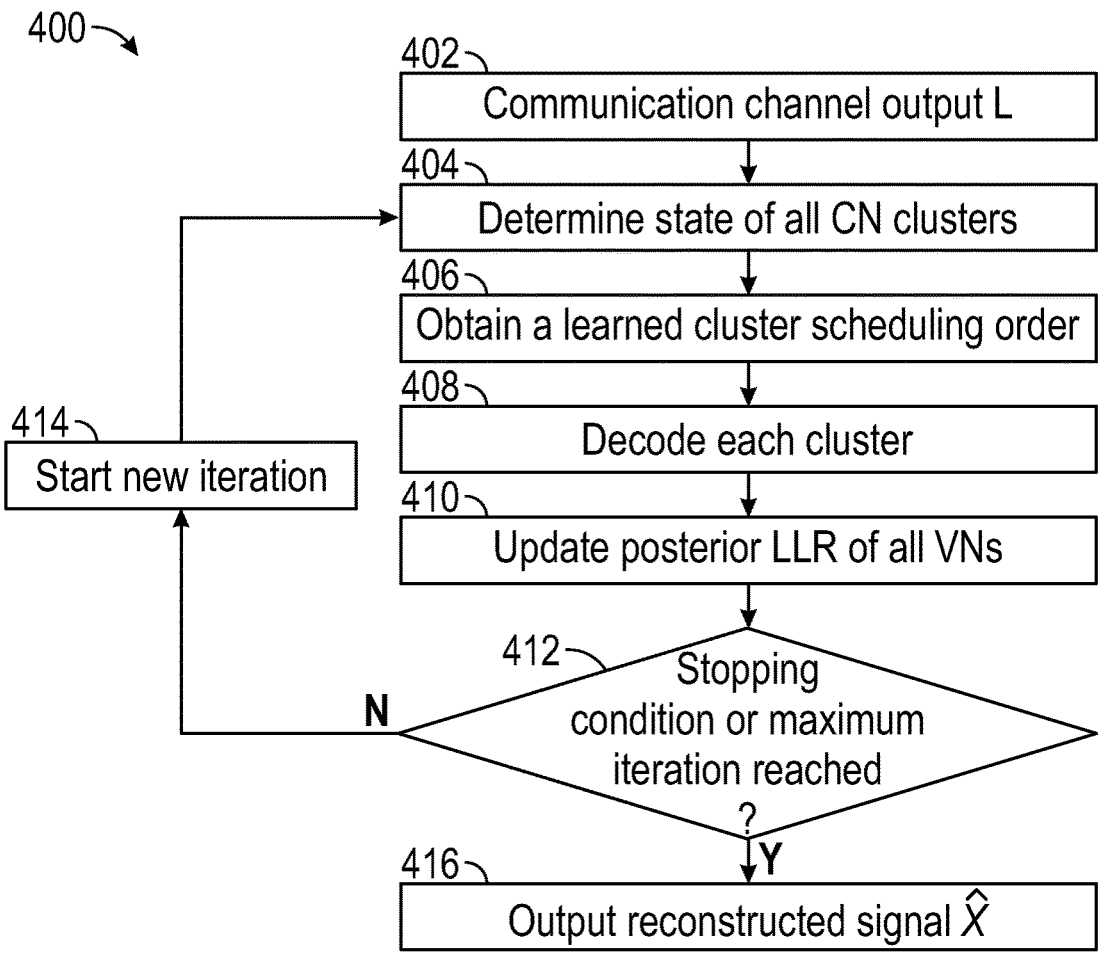
FIG. 4 is a flowchart that illustrates an example process for decoding LDPC codes in accordance with embodiments of the present disclosure.

FIG. 4 is a flowchart illustrating an example process 400 for reconstructing a received signal. At operation 402, an output L of a communication channel is received by a mobile communication device (e.g., mobile communication device 200), and at operation 404, the state of all check nodes (CNs) is determined by the LDPC decoder (e.g., LDPC decoder 228). At operation 406, a cluster scheduling order is learned by the software agent of the LDPC decoder. At operation 408, each cluster is decoded by the LDPC decoder 228, and a posterior log-likelihood ratio (LLR) of all variable nodes (VNs) is updated by the LDPC decoder. At operation 412, the LDPC decoder determines whether either a specified maximum number of iterations has been reached or a stopping condition has been satisfied. If not, the process 400 proceeds to operation 414 to start a new iteration beginning from operation 404. If the maximum number of iterations or the stopping condition is reached, the LDPC decoder outputs the reconstructed signal $\hat{x}$.

FIG. 5 illustrates an embodiment of the RL-SD algorithm 500 of the LDPC decoder 228 that can be executed by one or more processing devices (e.g., processing device(s) 204) for sequential LDPC code decoding in accordance with embodiments of the present disclosure. The inputs are the soft channel information vector $L=[L_0, \ldots, L_{n-1}]$ comprised of LLRs and a parity-check matrix H of the LDPC code. The output is the reconstructed signal $\hat{x}$ obtained after executing at most $I_{max}$ decoding iterations, or until the stopping condition is reached. The optimized scheduling order, learned using the methods described herein, is dynamic and depends on both the graph structure and on the received channel values.

The RL-SD process illustrated by FIG. 5 can be viewed as a sequential generalized LDPC (GLDPC) decoder when z>1, where BP decoding of a cluster-induced subgraph is analogous to decoding a sub-code of a GLDPC code. When z=1, each cluster represents a single parity-check code, as is the case in a regular LDPC code.

With respect to the software agent learning a cluster scheduling policy, the state of the MDP after scheduling a cluster index a during learning step l can be denoted as $\hat{x}_\alpha^{(l)}$, and the index of a realization of $\hat{x}_\alpha^{(l)}$ be referred to as $$s_a \in [[2^{l_a}]].$$

Thus, $s_\alpha$ also refers to the state of the MDP. The state space $\mathcal{S}$ of the MDP contains all possible $\Sigma_{\alpha \in \lceil m/z \rceil} 2^{l_\alpha}$ realizations of all the cluster outputs $\hat{x}_0^{(l)}, \ldots, \hat{x}_{\lceil m/z \rceil-1}^{(l)}$, where a realization can be considered as a (cluster, cluster state) pair. The action space can be defined as $\mathcal{A} = [\lceil m/z \rceil]$. Different Q-learning-based RL approaches can be used for solving the sequential decoding problem.

As an example using deep reinforcement learning (DRL), for MDPs with very large state spaces, the action-value function $Q_l(s, \alpha)$ can be approximated as $Q_l(s, \alpha; W)$ using a deep learning model with tensor W representing the weights connecting all layers in the neural network (NN). In each learning step l, a separate NN can be used with weight $W_l^{(\alpha)}$, for each cluster, since a single NN cannot distinguish between the signals $\hat{x}_\alpha^{(l)}, \ldots, \hat{x}_{\lceil m/z \rceil-1}^{(l)}$, and hence cannot distinguish between the rewards $R_0, \ldots, R_{\lceil m/z \rceil-1}$ generated by the $\lceil m/z \rceil$ different clusters. The target of the NN corresponding to cluster $\alpha$ is given by $$T_l^{(a)} = R_1(s_a, a, s') + \beta \max_{a' \in [\lceil m/z \rceil]} Q_1(s', a'; W_1^{(a)}), \tag{6}$$

where the reward $R_l(s_a, a, s') = R_a$. Also, let $Q_l(s_\alpha, \alpha; W_l^{(\alpha)})$ be the NN's prediction. In each DRL step, the mean squared error loss between $T_l^{(\alpha)}$ and $Q_l(s_\alpha, \alpha; W_l^{(\alpha)})$ can be minimized using a gradient descent method. The NN corresponding to each cluster learns to map the cluster output $\hat{x}_\alpha^{(l)}$ to a vector of $\lceil m/z \rceil$ predicted action-values $$[Q_l(s', 0; W_l^{(a)}), \ldots, Q_l(f(s_a, a), \lceil m/z \rceil - 1; W_l^{(a)})].$$

During inference, the optimized cluster scheduling policy, $\pi_i^{*(l)}$, for scheduling the ith cluster during decoder iteration I is expressed as $$\pi_i^{*(l)} = \text{argmax}_{a_i \in \mathcal{A} \setminus \{a_0, \ldots, a_{i-1}\}} Q^*(s_{a_i}^{(l)}, a_i; W_{a_i}), \tag{7}$$

where $s_{\alpha_i}^{(l)}$ is the state of cluster $\alpha_i$ during decoder iteration I, and $W_{\alpha_i}$ represents the optimized weight tensor of the NN that generates the optimized action-value $Q^*(s_{\alpha_i}^{(l)}, \alpha_i; W_{\alpha_i})$. The cluster scheduling policy $\pi_i^{*(l)}$ can be incorporated in step/line 9 of the process illustrated in FIG. 5 to determine the optimized cluster scheduling order.

As another example using standard Q-learning, for MDPs with moderately large state spaces, a standard Q-learning approach can be used for determining the optimal cluster scheduling order, where the action-value for choosing cluster a in state $s_a$ is given by $$Q_{l+1}(s_a, a) = (1-\alpha)Q_l(s_a, a) + \alpha\left(R_a + \beta \max_{a' \in [\lceil m/z \rceil]} Q_l(s'_a, a')\right) \tag{8}$$

In each learning step l, cluster a can be selected via a ε-greedy approach according to $$a = \begin{cases} \text{selected randomly w.p. } \varepsilon \text{ from } A, \\ \pi_Q^{(l)}, \text{ selected w.p. } 1 - \varepsilon \end{cases} \quad (9)$$

where $\pi_Q^{(l)} = \max_{\alpha \in \{\lceil m/z \rceil\}} Q_L(s_\alpha, \alpha)$. For ties (as in the first iteration of the standard Q-learning algorithm shown in FIG. 6 for l=0 and the first L), an action can be selected uniformly at random from all the maximizing actions. During inference, the optimized cluster scheduling policy of standard Q-learning, $$\overrightarrow{\pi_i^{*(l)}},$$

for scheduling the ith cluster during decoder iteration I can be expressed as $$\overrightarrow{\pi_I^{*(l)}} = \text{argmax}_{a_i \in \mathcal{A} \setminus \{a_0, \ldots, a_{i-1}\}} Q^*(s_{a_i}^{(l)}, a_i), \quad (10)$$

here $Q^*(s_{\alpha_i}^{(l)}, \alpha_i)$ represents the optimized action value once training has been accomplished. The cluster scheduling policy $\pi_i^{*(l)}$ can be incorporated in step/line 9 of the process illustrated in FIG. 5 to determine the optimized cluster scheduling order.

FIG. 6 illustrates an embodiment of the standard Q-learning algorithm 600 of the LDPC decoder 228 that can be executed by one or more processing devices (e.g., processing device(s) 204) for sequential LDPC code decoding in accordance with embodiments of the present disclosure. The input to the algorithm can be a set $\mathcal{L} = \{L_0, \ldots, L_{|\mathcal{L}|-1}\}$ containing $|\mathcal{L}|$ realizations of L over which Q-learning is performed, and a parity-check matrix H. The output is $Q^*(s_{\alpha_i}^{(l)}, \alpha_i)$. For each $L \in \mathcal{L}$, the action-value function in equation 8 can be recursively updated $l_{max}$ times.

Experimental Results

Experiments were performed to test the performance of the RL-SD process shown in FIG. 5, where the cluster scheduling policy of step/line 9 is learned using both Deep RL and standard Q-learning as described herein. As a benchmark, the RL-SD process is compared with flooding (i.e. all clusters are updated simultaneously per iteration) and a scheme where the cluster scheduling order is randomly generated. Each scheme for decoding is used with both [384, 256]-Wireless Regional Area Network (WRAN) irregular and (3, 5) AB-LDPC codes. For both codes, the choice of block length (at most 500 bits) is influenced by the run-time of the standard Q-learning algorithm (e.g., an embodiment of which is shown in FIG. 6) of the LDPC decoder.

Figure 7:
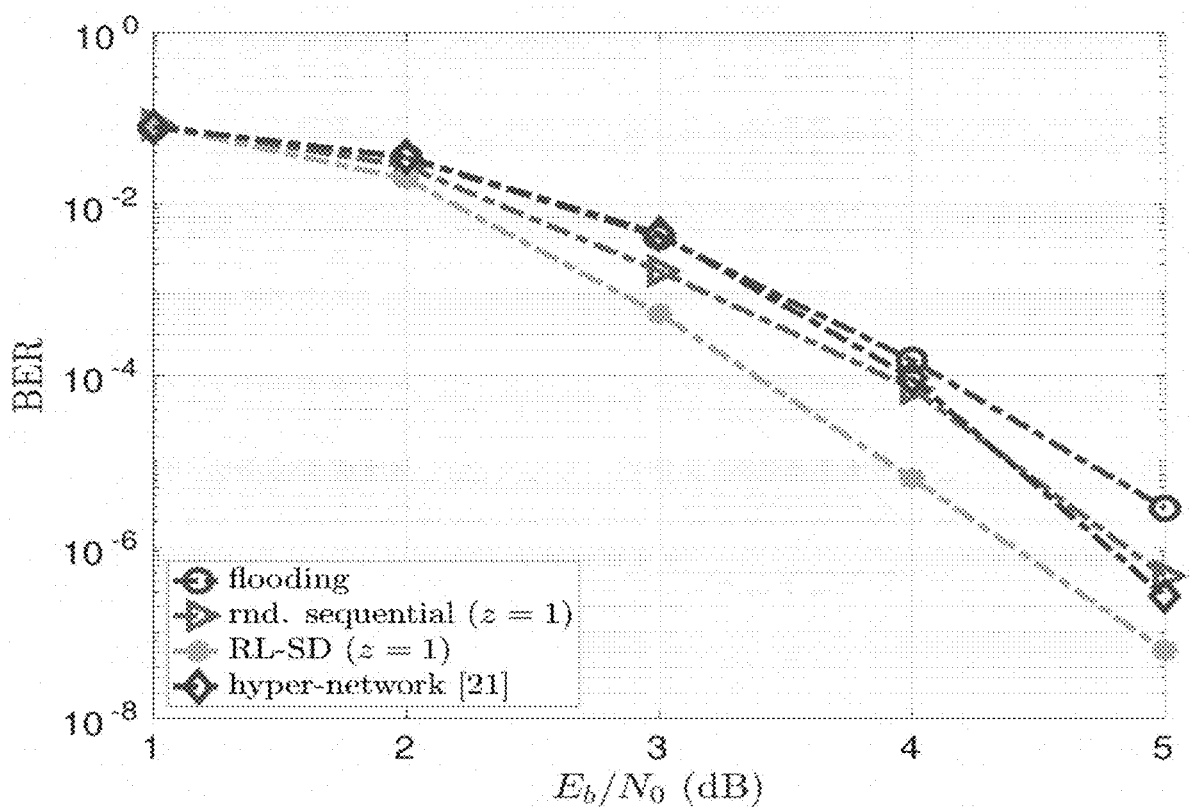
FIG. 7 is a graph illustrating bit error rate (BER) results using different belief propagation (BP) decoding schemes for a [384, 256]-WRAN LDPC code with block length n=384 in accordance with embodiments of the present disclosure.
Figure 8:
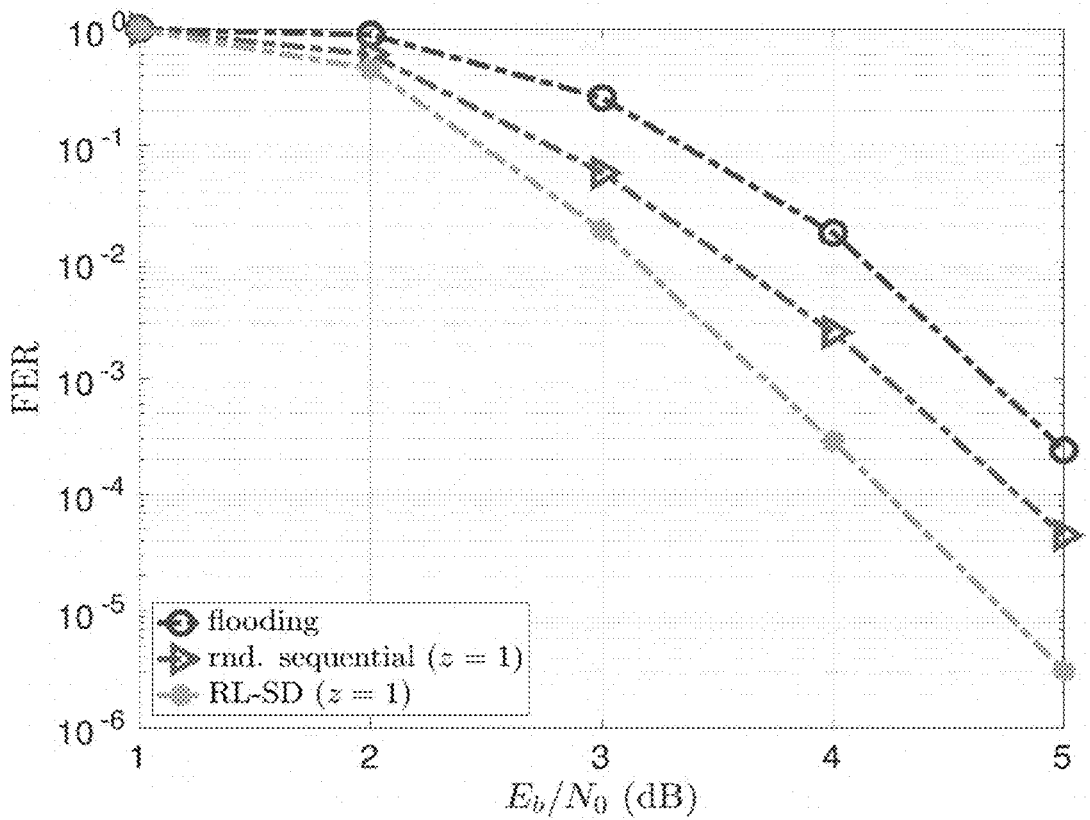
FIG. 8 is a graph illustrating frame error rate (FER) results using different belief propagation (BP) decoding schemes for a [384, 256]-WRAN LDPC code with block length n=384 in accordance with embodiments of the present disclosure.
Figure 9:
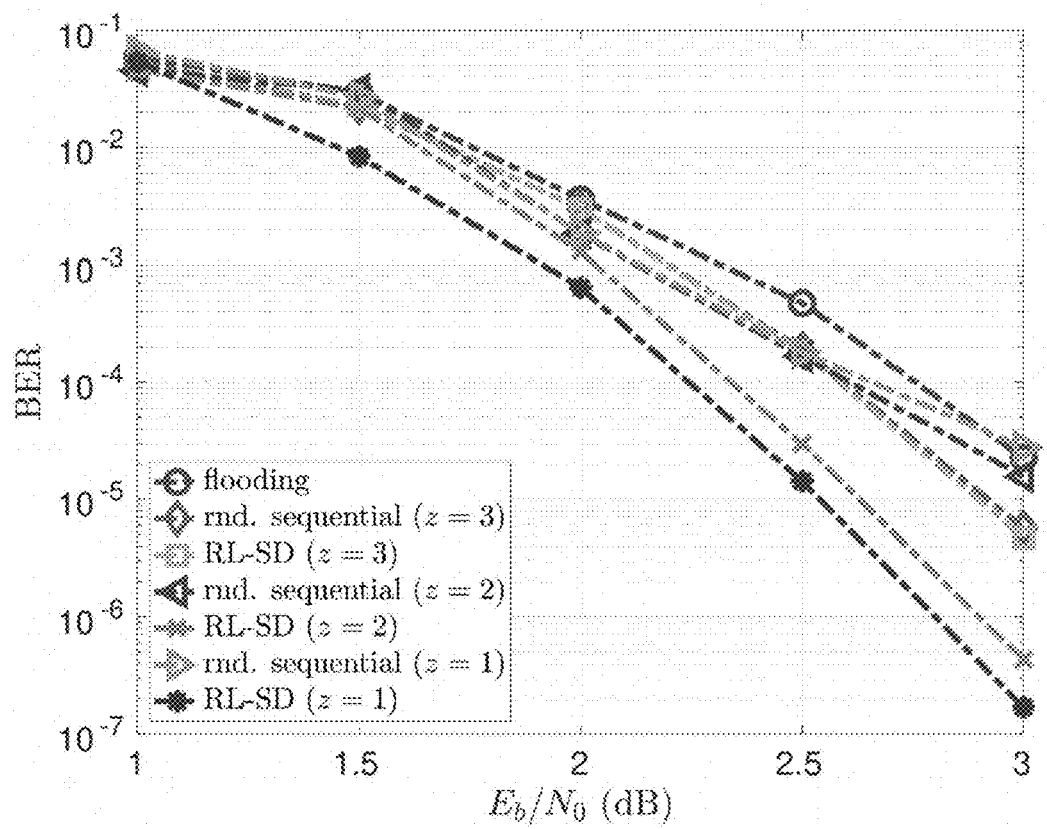
FIG. 9 is a graph illustrating bit error rate (BER) results using different belief propagation (BP) decoding schemes for a (3, 5) AB-LDPC code with block length n=500 in accordance with embodiments of the present disclosure.
Figure 10:
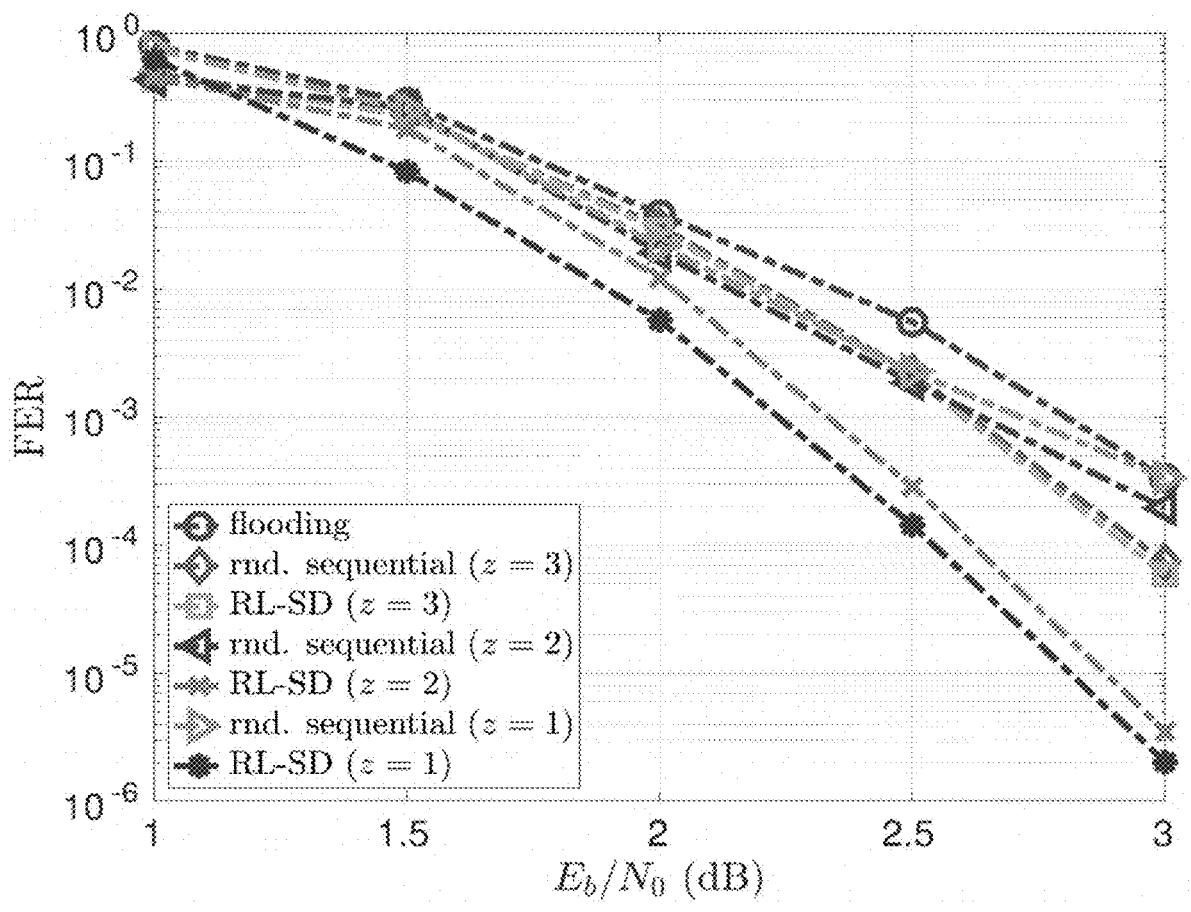
FIG. 10 is a graph illustrating frame error rate (FER) results using different belief propagation (BP) decoding schemes for a (3, 5) AB-LDPC code with block length n=500 in accordance with embodiments of the present disclosure.

FIGS. 7-10 illustrate the bit error rate and frame error rate results of the experiments as compared to a conventional flooding scheme. FIG. 7 is a graph illustrating bit error rate (BER) results using different belief propagation (BP) decoding schemes for a [384, 256]-WRAN code with block length n=384 in accordance with embodiments of the present disclosure. FIG. 8 is a graph illustrating frame error rate (FER) results using different belief propagation (BP) decoding schemes for a [384, 256]-WRAN code with block length n=384 in accordance with embodiments of the present disclosure. FIG. 9 is a graph illustrating bit error rate (BER) results using different belief propagation (BP) decoding schemes for a (3, 5) AB-LDPC code with block length n=500 in accordance with embodiments of the present disclosure. FIG. 10 is a graph illustrating frame error rate (FER) results using different belief propagation (BP) decoding schemes for a (3, 5) AB-LDPC code with block length n=500 in accordance with embodiments of the present disclosure. The y-axis in FIGS. 7 and 9 corresponds to a bit error rate (BER) and the y-axis in FIGS. 8 and 10 corresponds to a frame error rate (FER). The x-axes in FIGS. 7-10 correspond to a signal-to-noise ratio (SNR), in terms of Eb/N0 in dB.

The LLR vectors used for training are sampled uniformly at random over a range of A equally spaced SNR values for a given code. Hence, there are $|L|/A$ LLR vectors in $\mathcal{L}$ for each SNR value considered. For both considered codes (e.g., [384, 256]-WRAN and (3, 5)-AB LDPC codes), the learning parameters can be as follows: $\alpha=0.1$, $\beta=0.9$, $\varepsilon=0.6$, $1_{max}=50$, and $|\mathcal{L}|=5\times10^5$, where $|\mathcal{L}|$ is chosen to ensure that the training is as accurate as possible without incurring excessive run-time for the standard Q-learning algorithm (e.g., an embodiment of which is shown in FIG. 6). Once RL is accomplished using either DRL or standard Q-learning, the corresponding cluster scheduling policy for each code is incorporated in step/line 9 of the algorithm illustrated in FIG. 5, resulting in RL-SD for that code. For decoding, the maximum number of iterations is set to 50 ($I_{max}=50$). Note that in case of DRL, each cluster NN is based on a feed-forward architecture with an input layer of size $1_a$, two hidden layers of sizes 250 and 125, respectively, and an output layer of size $\lceil m/z \rceil$. The activation function used for the hidden and output layers are rectified linear unit and sigmoid, respectively.

For both training and inference, the AWGN channel is considered and all-zero codewords are transmitted using BPSK modulation. Training with the all-zero codeword is sufficient as, due to the symmetry of the BP decoder and the channel, the decoding error is independent of the transmitted signal.

$$Pr[\hat{x}_v \neq x_v], v \in [[n]],$$

and the frame error rate (FER), given by $Pr[\hat{x} \neq x]$. In the case of the WRAN LDPC code, z=1 is only considered as this code has several degree-11 CNs which render both learning schemes too computationally intensive for z>1. On the other hand, for the AB code, multiple cluster sizes are chosen from $z \in \{1, 2, 3\}$ for both the random and RL-SD schemes. For $z \in \{1, 2\}$, standard Q-learning can be employed to learn the cluster scheduling policy. For z=3, deep reinforcement learning (DRL) can be utilized, as standard Q-learning is not feasible due to the significantly increased state space. The same number of training examples are used for both standard Q-learning and DRL.

The BER vs. channel signal-to-noise ratio (SNR), in terms of Eb/N0 in dB, for the [384, 256]-WRAN and (3, 5) AB-LDPC codes using these decoding techniques are shown in FIGS. 7 and 9, respectively. The experimental results reveal that sequential decoding of clusters outperforms the flooding scheme. Furthermore, regardless of the cluster size, the RL-SD scheme outperforms the random sequential scheduling schemes, revealing the benefit of RL. For both codes, the RL-SD scheme outperforms the other decoding schemes, including the state-of-the art hyper-network decoder (in case of the WRAN LDPC code) with a gain of around 0.5 dB for fixed BER. Note that for both codes, sequential decoding performance improves as the cluster size is reduced, mainly because the subgraphs induced by the smaller clusters are less likely to contain detrimental objects, such as cycles and absorbing sets. The FER vs. SNR performance shown in FIGS. 8 and 10 show similar behavior.

In Table 1, the average number of CN to VN messages propagated in the considered decoding schemes are compared to attain the results in FIGS. 7-10. The numbers without (resp. with) parentheses correspond to the (3, 6)-regular (resp. (3, 5) AB-) LDPC code. The RL-SD algorithm, on average, generates a lower number of CN to VN messages when compared to the other decoding schemes, irrespective of the cluster size. Thus, the RL-SD scheme also provides a significant reduction in message-passing complexity for moderate length LDPC codes.

| SNR (dB)       | 1    | 2    | 3    |
|----------------|------|------|------|
| flooding       | 6480 | 6422 | 5171 |
| random (z = 1) | 6480 | 5827 | 3520 |
| RL-SD (z = 1)  | 6467 | 5450 | 3179 |

| SNR (dB)       | 1     | 2     | 3    |
|----------------|-------|-------|------|
| flooding       | 63750 | 16409 | 8123 |
| random (z = 3) | 44338 | 11102 | 5005 |
| RL-SD (z = 3)  | 40448 | 10694 | 4998 |
| random (z = 2) | 36328 | 10254 | 4994 |
| RL-SD (z = 2)  | 31383 | 7349  | 4225 |
| random (z = 1) | 59750 | 10692 | 4812 |
| RL-SD (z = 1)  | 51250 | 6240  | 3946 |

Table 1: Average number of CN to VN messages propagated in various decoding schemes for a [384, 256]-WRAN (left) and (3,5) AB-(right) LDPC code to attain the results shown in FIGS. 7-10

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

The foregoing description of the specific embodiments of the subject matter disclosed herein has been presented for purposes of illustration and description and is not intended to limit the scope of the subject matter set forth herein. It is fully contemplated that other various embodiments, modifications and applications will become apparent to those of ordinary skill in the art from the foregoing description and accompanying drawings. Thus, such other embodiments, modifications, and applications are intended to fall within the scope of the following appended claims. Further, those of ordinary skill in the art will appreciate that the embodiments, modifications, and applications that have been described herein are in the context of particular environment, and the subject matter set forth herein is not limited thereto but can be beneficially applied in any number of other manners, environments, and purposes. Accordingly, the claims set forth below should be construed in view of the full breadth and spirit of the novel features and techniques as disclosed herein.

The invention claimed is:

1. A method for decoding low-density parity-check codes encoded in a traffic channel of a communication signal received by a mobile communication device, the method comprising:
generating a decoding schedule for each of a plurality of clusters of check nodes in response to execution of a reinforcement learning software agent of a low-density parity check (LDPC) decoder, wherein the decoding schedule is generated based on a reward associated with an outcome of decoding each of the plurality of clusters of check nodes, and wherein the reward corresponds to a probability that corrupted bits of the communication signal are correctly reconstructed;
sequentially decoding each of the plurality of clusters of check nodes according to the decoding schedule;
updating a posterior log-likelihood ratio of all variable nodes (VNs) based on the sequential decoding schedule;
determining whether a specified maximum number of iterations has been reached or a stopping condition has been satisfied based on the sequential decoding schedule;
in response to determining that the specified maximum number of iterations is reached or the stopping condition is satisfied, outputting a reconstructed signal corresponding to the communication signal received by the mobile communication device.

2. The method of claim 1, further comprising establishing a cluster scheduling policy based on the training.

3. The method of claim 2, wherein the decoding schedule is determined based on the cluster scheduling policy.

4. The method of claim 1, further comprising clustering the check nodes into the plurality of clusters to minimize inter-cluster dependency.

5. The method of claim 1, wherein the reinforcement learning software agent implements at least one of a Q-learning or a deep reinforcement learning scheme to generate the cluster scheduling policy.

6. A system for decoding low-density parity-check codes encoded in a traffic channel of a communication signal received by a mobile communication device, the system comprising:
a non-transitory computer-readable medium storing instructions for decoding low-density parity-check codes; and
a processing device executing the instructions to:
generate a decoding schedule for each of a plurality of clusters of check nodes in response to execution of a reinforcement learning software agent of a low-density parity check (LDPC) decoder, wherein the decoding schedule is generated based on a reward associated with an outcome of decoding each of the plurality of clusters of check nodes, and wherein the reward corresponds to a probability that corrupted bits of the communication signal are correctly reconstructed;
sequentially decode each of the plurality of clusters of check nodes according to the learned scheduling policy;
update a posterior log-likelihood ratio of all variable nodes (VNs) based on the sequential decoding schedule;
determine whether a specified maximum number of iterations has been reached or a stopping condition has been satisfied based on the sequential scheduling policy;

output a reconstructed signal corresponding to the communication signal received by the mobile communication device in response to determining that the specified maximum number of iterations is reached, or the stopping condition is satisfied.

7. The system of claim 6, wherein the processing device executes the instructions to establish a cluster scheduling policy based on the training.

8. The system of claim 7, wherein the decoding schedule is determined based on the learned cluster scheduling policy.

9. The system of claim 6, wherein the processing device executes the instructions to cluster the check nodes into the plurality of clusters to minimize inter-cluster dependency.

10. The system of claim 6, wherein the reinforcement learning software agent implements at least one of a Q-learning or a deep reinforcement learning to generate the decoding schedule.

11. A non-transitory computer-readable medium comprising instructions, wherein execution of the instructions by a processing device causes the processing device to:
generate a decoding schedule for each of a plurality of clusters of check nodes in response to execution of a reinforcement learning software agent of a low-density parity check (LDPC) decoder, wherein the decoding schedule is generated based on a reward associated with an outcome of decoding each of the plurality of clusters of check nodes, and wherein the reward corresponds to a probability that corrupted bits of the communication signal are correctly reconstructed;
sequentially decode each of the plurality of clusters of check nodes according to the learned scheduling policy;
update a posterior log-likelihood ratio of all variable nodes (VNs) based on the learned sequential scheduling policy;
determine whether a specified maximum number of iterations has been reached or a stopping condition has been satisfied based on the sequential cluster scheduling policy;
output a reconstructed signal corresponding to the communication signal received by the mobile communication device in response to determining that the specified maximum number of iterations is reached or the stopping condition is satisfied.

12. The medium of claim 11, wherein execution of the instructions by the processing device causes the processing device to establish a cluster scheduling policy based the training.

13. The medium of claim 12, wherein the decoding schedule is determined based on the sequential cluster scheduling policy.

14. The medium of claim 11, wherein the reinforcement learning software agent implements at least one of a Q-learning or a deep reinforcement learning to generate the decoding schedule.

* * * * *